United States Patent
Chitnis et al.

(10) Patent No.: US 12,372,589 B2
(45) Date of Patent: Jul. 29, 2025

(54) FLOATING PIN DETECTION

(71) Applicant: TEXAS INSTRUMENTS INCORPORATED, Dallas, TX (US)

(72) Inventors: Ashutosh Chitnis, Ambernath (IN); Divya Kaur, Delhi (IN); Rajat Chauhan, Bangalore (IN); Shuvam Prasad, Faridabad (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 382 days.

(21) Appl. No.: 18/154,891

(22) Filed: Jan. 16, 2023

(65) Prior Publication Data
US 2024/0079823 A1 Mar. 7, 2024

(30) Foreign Application Priority Data
Sep. 1, 2022 (IN) .............................. 202241049876

(51) Int. Cl.
*G01R 31/55* (2020.01)
*G01R 31/50* (2020.01)

(52) U.S. Cl.
CPC .............. *G01R 31/55* (2020.01); *G01R 31/50* (2020.01)

(58) Field of Classification Search
CPC ......... G01R 31/00; G01R 31/50; G01R 31/55
USPC ....................... 324/500, 512, 527, 76.11, 149
See application file for complete search history.

(56) References Cited

U.S. PATENT DOCUMENTS

| | | | | |
|---|---|---|---|---|
| 4,385,398 A | * | 5/1983 | Wycoff | H04W 88/027 340/7.49 |
| 9,369,139 B1 | * | 6/2016 | Chu | H03L 3/00 |

FOREIGN PATENT DOCUMENTS

| | | | |
|---|---|---|---|
| CN | 108540121 A | * | 9/2018 |
| DE | 102012112256 A1 | * | 6/2013 |
| EP | 0450804 B1 | * | 12/1998 |
| JP | H08330437 A | * | 12/1996 |
| JP | H1028041 A | * | 1/1998 |
| KR | 20230082173 A | * | 6/2023 |

* cited by examiner

*Primary Examiner* — Hoai-An D. Nguyen
(74) *Attorney, Agent, or Firm* — Valerie M. Davis; Frank D. Cimino

(57) ABSTRACT

A float detector includes a latch and a float detection circuit. The latch includes a latch output and an input/output (I/O) terminal. The I/O terminal is coupled to an input terminal. The float detection circuit includes a detection input, a drive output, and a float detection circuit. The detection input is coupled to the latch output. The drive output is coupled to the I/O terminal. The float detector is configured to provide a drive signal at the drive output, and determine that the input terminal is floating based on a latch output signal received at the detection input responsive to the drive signal.

20 Claims, 6 Drawing Sheets

US 12,372,589 B2

FLOATING PIN DETECTION

CROSS-REFERENCE TO RELATED APPLICATIONS

This application claims priority to India Provisional Application No. 202241049876, filed Sep. 1, 2022, entitled "Digitally Controlled Scheme to Detected Floating State of an IC Pin," which is hereby incorporated by reference.

BACKGROUND

In a digital circuit, a valid signal may be provided by driving an input terminal (also referred to as an input pin) to a logic high voltage or a logic low voltage. An undriven terminal may be referred to as a floating terminal. A floating terminal can cause a variety of operational problems in the circuitry coupled to the terminal. For example, a floating terminal can cause unknown states in the circuitry coupled to the terminal, or produce unintended current paths that can damage circuit components or discharge the circuit's power source.

SUMMARY

In one example, a float detector includes a first latch, a second latch, a third latch, a control circuit, a pull-up circuit, and a pull-down circuit. The first latch has a first clock input and a first latch output. The second latch has a second clock input and a second latch output. The second clock input is coupled to the first clock input. The third latch is coupled between the first clock input and an input terminal. The control circuit has a first control input, a second control input, a first control output, and a second control output. The first control input is coupled to the first latch output. The second control input is coupled to the second latch output. The pull-up circuit has a current output and a third control input. The current output is coupled to the input terminal. The third control input is coupled to the first control output. The pull-down circuit has a current input and a fourth control input. The current input is coupled to the input terminal. The fourth control input is coupled to the second control output.

In another example, a float detector includes a latch and a float detection circuit. The latch includes a latch output and an input/output (I/O) terminal. The I/O terminal is coupled to an input terminal. The float detection circuit includes a detection input, a drive output, and a float detection circuit. The detection input is coupled to the latch output. The drive output is coupled to the I/O terminal. The float detector is configured to provide a drive signal at the drive output, and determine that the input terminal is floating based on a latch output signal received at the detection input responsive to the drive signal.

In a further example, a watchdog circuit includes a float detector and a timer. The float detector includes a latch and a float detection circuit. The latch includes a latch output and an input/output (I/O) terminal. The I/O terminal is coupled to an input terminal. The float detection circuit includes a detection input, a drive output, a float output, and a float detector. The detection input is coupled to the latch output. The drive output is coupled to the I/O terminal. The float detector is configured to provide a drive signal at the drive output, and determine that the input terminal is floating based on a latch output signal received at the detection input responsive to the drive signal. The float detector is also configured to provide, at the float output, a float signal indicating that the input terminal is floating. The timer has a reset input and an enable input. The reset input is coupled to the latch output. The enable input is coupled to float output.

DETAILED DESCRIPTION

Figure 1:
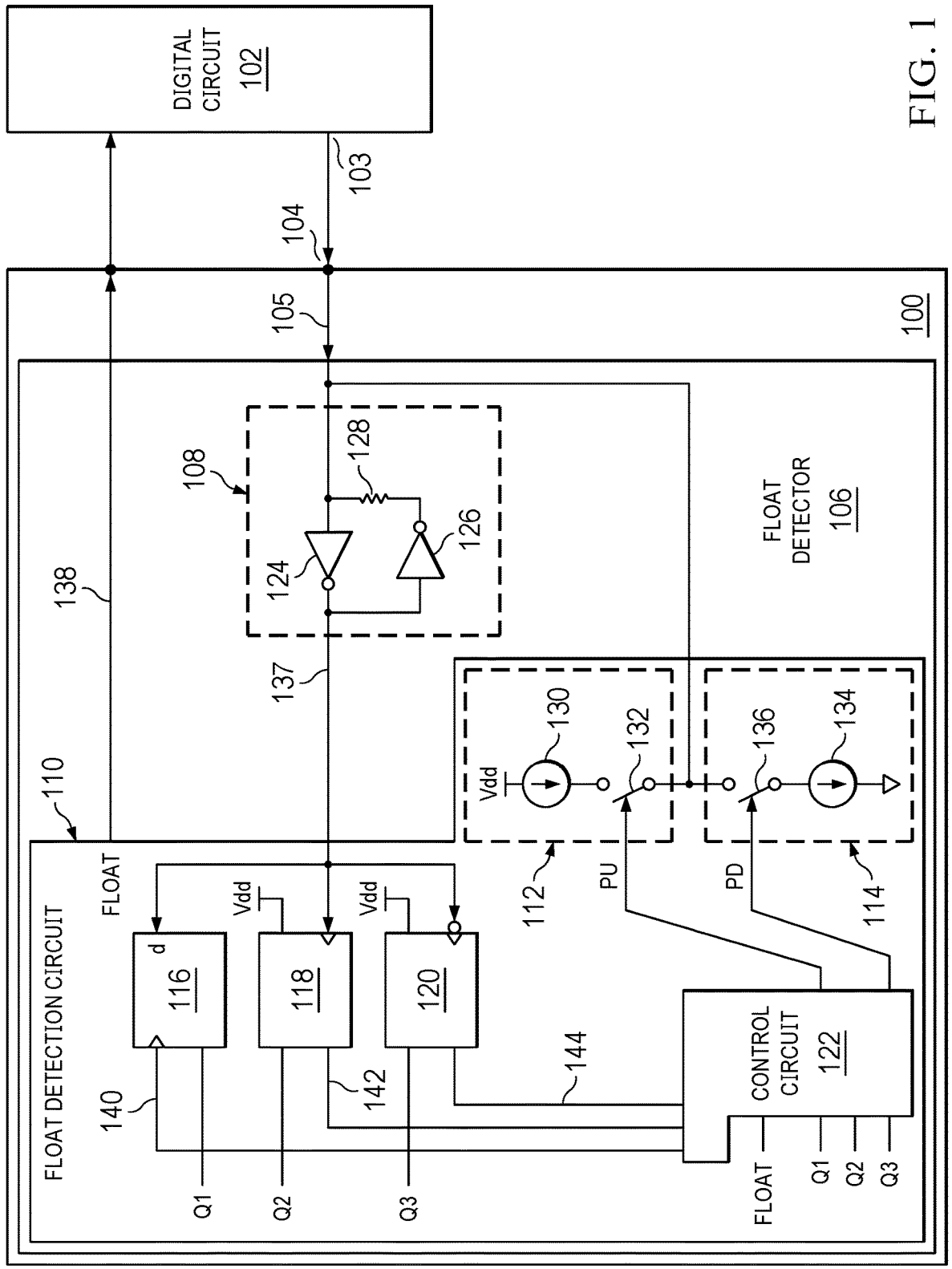
FIG. 1 is a block diagram of an example float detector implemented in an electronic circuit.

FIG. 1 is a block diagram of an example float detector 106 implemented in an electronic circuit 100. The electronic circuit 100 includes an input terminal 104 and the float detector 106 coupled to the input terminal 104. A digital circuit 102 is coupled to the input terminal 104 external to the electronic circuit 100. The digital circuit 102 may be a microcontroller, a field programmable gate array, or any other digital circuit. The digital circuit 102 generally drives the input terminal 104 to a valid logic voltage (e.g., a logic low voltage or a logic high voltage). However, before the digital circuit 102 has entered an operational state or if the digital circuit 102 has disabled drive to the input terminal 104, then the digital circuit 102 may not source current to or sink current from the input terminal 104, leaving the input terminal 104 floating. For example, an input/output (I/O) port 103 of the digital circuit 102 be configured as an input at power-up and reconfigured to operate as an output during initialization of the digital circuit 102.

The float detector 106 determines whether the input terminal 104 is floating. The float detector 106 includes a latch circuit 108 and float detection circuit 110. An output of the latch circuit 108 is coupled to the float detection circuit 110, and an I/O terminal of the latch circuit 108 is coupled to the input terminal 104. The latch circuit 108 includes an inverter 124, an inverter 126, and a resistor 128. An input of the inverter 124 is coupled to the input terminal 104, and an output of the inverter 124 is coupled to an input of the inverter 126. The resistor 128 is coupled between the input terminal 104 and an output of the inverter 126. The resistor 128 limits the current flow between the output of the inverter 126 and the input terminal 104. For example, the resistor 128 may limit the current flowing between the output of the inverter 126 and the input terminal 104 to a microampere or less. The latch circuit 108 ensures that the input terminal 104 is at a valid logic level when not driven by the digital circuit 102, and ensures that circuitry of the electronic circuit 100 (the float detection circuit 110 and other circuitry of the electronic circuit 100) driven from the digital circuit 102 is provided with valid logic levels.

The float detection circuit 110 includes a latch 116, a latch 118, a latch 120, a control circuit 122, a pull-up circuit 112, and a pull-down circuit 114. A detection input of the float detection circuit 110 is coupled to the output of the latch circuit 108 for receipt of a latch output signal 137. A drive output of the float detection circuit 110 provides a drive signal to the I/O terminal of the latch circuit 108. The pull-down circuit 114 draws current from the input terminal 104 and the pull-up circuit 112 conducts current to the input terminal 104 to determine whether the input terminal 104 is floating. The pull-down circuit 114 includes a current source 134 and a switch 136. A first terminal of the switch 136 (a current input of the pull-down circuit 114) is coupled to the input terminal 104, and a second terminal of the switch 136 is coupled to a sink input of the current source 134. An output of the current source 134 is coupled to a ground terminal. A switch control input of the switch 136 is coupled to a control output of the control circuit 122. A pull-down signal (PD) provided by the control circuit 122 (at the control output) closes the switch 136 to draw current from the input terminal 104 through the switch 136 and the current source 134. The current source 134 may draw about 10 microamperes of current from the input terminal 104 in some implementations of the pull-down circuit 114.

The pull-up circuit 112 includes a current source 130 and a switch 132. A first terminal of the switch 132 (a current output of the pull-up circuit 112) is coupled to the input terminal 104, and a second terminal of the switch 132 is coupled to a source output of the current source 130. An input of the current source 130 is coupled to a power supply terminal. A switch control input of the switch 132 is coupled to a control output of the control circuit 122. A pull-up signal (PU) provided by the control circuit 122 (at the control output) closes the switch 132 to conduct current to the input terminal 104 through the switch 132 and the current source 130. The current source 130 may provide about 10 microamperes of current to the input terminal 104 in some implementations of the pull-up circuit 112.

The latch 116 samples the latch output signal 137 provided at the latch output of the latch circuit 108. A data input of the latch 116 is coupled to the latch output of the latch circuit 108. A clock input of the latch 116 is coupled to a clock output of the control circuit 122. An output of the latch 116 is coupled to an input of the control circuit 122. The control circuit 122 provides a clock signal 140 to the latch 116. Responsive to the clock signal 140, the latch 116 captures a sample of the latch output signal 137, and provides the sampled signal (Q1) to the control circuit 122. The latch 116 may be implemented using a D-type flip-flop.

The latch 118 detects a rising edge (a logic low to logic high transition) on the latch output signal 137. A clock input of the latch 118 is coupled to the output of the latch circuit 108. A data input of the latch 118 is coupled to the power supply terminal. A reset input of the latch 118 is coupled to a first reset output of the control circuit 122. An output of the latch 118 (latch output) is coupled to a control input of the control circuit 122. The control circuit 122 provides a reset signal 142 to the latch 118. When the latch 118 is not held reset by the control circuit 122 (when determining whether the input terminal 104 is floating), a rising edge at the clock input of the latch 118 (a rising edge of the latch output signal 137) causes the edge detected signal Q2 provided at the output of the latch 118 to go to a logic high voltage. The latch 118 may be implemented using a D-type flip-flop.

The latch 120 detects a falling edge (a logic high to logic low transition) on the latch output signal 137. A clock input of the latch 120 is coupled to the output of the latch circuit 108. A data input of the latch 118 is coupled to the power supply terminal. A reset input of the latch 120 is coupled to a second reset output of the control circuit 122. An output of the latch 120 is coupled to a control input of the control circuit 122. The control circuit 122 provides a reset signal 144 to the latch 120. When the latch 120 is not held reset by the control circuit 122, a falling edge at the clock input of the latch 120 (a falling edge of the latch output signal 137) causes the edge detected signal Q3 provided at the output of the latch 120 to go to a logic high voltage. The latch 120 may be implemented using a D-type flip-flop.

The control circuit 122 controls the pull-up circuit 112, the pull-down circuit 114, the latch 116, the latch 118, and the latch 120 to determine whether the input terminal 104 is floating. The control circuit 122 may include a state machine circuit that controls the float detection process. When the signal Q2 and the signal Q3 are logic high voltage responsive to pull-up and pull-down initiated by the control circuit 122, the control circuit 122 may deem the input terminal 104 to be floating, and provide a floating terminal detected signal (FLOAT signal 138) at an output of the control circuit 122.

Figure 2:
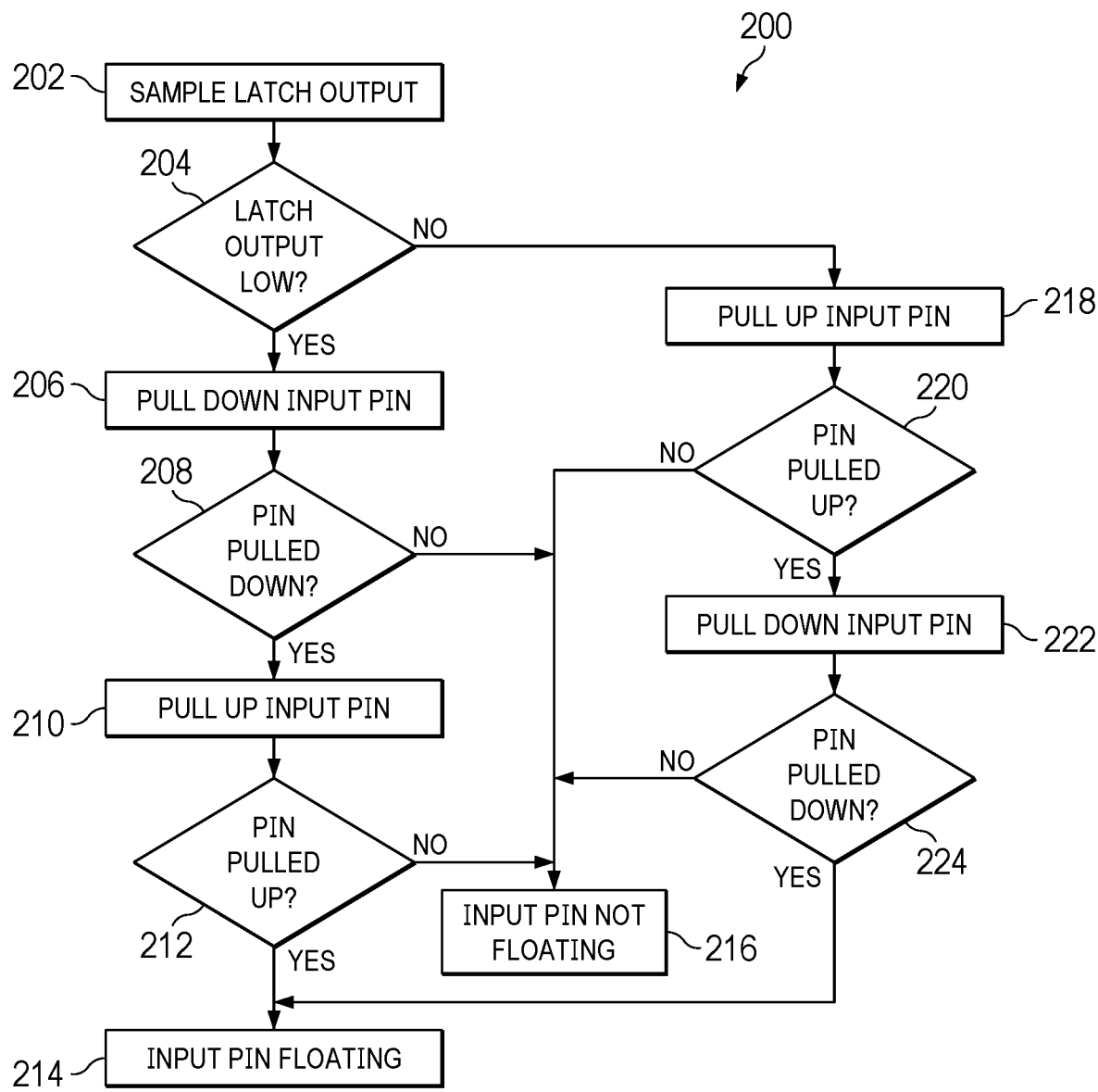
FIG. 2 is a flow diagram for an example method for detecting a floating terminal using the float detector of FIG. 1.

FIG. 2 is a flow diagram for an example method 200 for detecting a floating terminal. The method 200 may be performed by the float detector 106, and controlled by the control circuit 122. Though depicted sequentially as a matter of convenience, at least some of the operations shown can be performed in a different order and/or performed in parallel. Additionally, some implementations may perform only some of the operations shown. The control circuit 122 may be configured to perform the method 200 periodically at a selected interval, where the interval may be selected at run-time, at device power up, at manufacture, etc.

In block 202, the switch 132 is open, the switch 136 is open, the latches 118 and 120 may be reset, and the float detector 106 samples the latch output signal 137. The control circuit 122 provides a rising edge on the clock signal 140 to clock the latch 116 and sample the latch output signal 137.

In block 204, if the latch output signal 137 is sampled to be a logic low voltage (Q1 is a logic low voltage), then, the float detector 106 draws current from the input terminal 104 to pull the input terminal 104 low in block 206. The control circuit 122 releases the latch 118 from reset (via the reset signal 142), and provides the PD signal to close the switch 136 and draw current from the input terminal 104 through the pull-down circuit 114. If the input terminal 104 is not being driven by the digital circuit 102, then the current drawn by the pull-down circuit 114 pulls the input terminal 104 to a logic low voltage, and the latch output signal 137 transitions from a logic low voltage to a logic high voltage (a rising edge). The rising edge of the latch output signal 137 clocks the latch 118, and the output signal Q2 of the latch 118 transitions from a logic low voltage to a logic high voltage. If the input terminal 104 is being driven by the digital circuit 102 (the input terminal 104 is not floating), then the current drawn by the pull-down circuit 114 does not pull the input terminal 104 to a logic low voltage, the latch output signal 137 remains at a logic low voltage, and the output Q2 of the latch 118 does not transition to logic high voltage.

In block 208, the control circuit 122 determines whether the input terminal 104 is pulled low (a rising edge of the latch output signal 137 clocked the latch 118). If the input terminal 104 is not a logic low voltage, then the control circuit 122 deems the input terminal 104 not floating in block 216. The control circuit 122 opens the switch 132 and the switch 136 in block 216.

If the input terminal 104 is at a logic low voltage (Q2 is a logic high), then the float detector 106 provides current to the input terminal 104 to pull the input terminal 104 high in block 210. The control circuit 122 opens the switch 136, releases the latch 120 from reset (via the reset signal 144), and provides the PU signal to close the switch 132 and provide current to the input terminal 104 through the pull-up circuit 112. If the input terminal 104 is not being driven by the digital circuit 102, then the current provided by the pull-up circuit 112 pulls the input terminal 104 to a logic high voltage, and the latch output signal 137 transitions from a logic high voltage to a logic low voltage (a falling edge). The falling edge of the latch output signal 137 clocks the latch 120, and the output signal Q3 of the latch 120 transitions from a logic low voltage to a logic high voltage. If the input terminal 104 is being driven by the digital circuit 102 (the input terminal 104 is not floating), then the current provided by the pull-up circuit 112 does not pull the input terminal 104 to a logic high voltage, the latch output signal 137 remains at a logic high voltage, and the output Q3 of the latch 120 does not transition to logic high voltage.

In block 212, the control circuit 122 determines whether the input terminal 104 is pulled high (a falling edge of the latch output signal 137 clocked the latch 120). If the input terminal 104 is not a logic high voltage, then the control circuit 122 deems the input terminal 104 not floating in block 216. The control circuit 122 opens the switch 132 and the switch 136 in block 216.

If the input terminal 104 is a logic high voltage, then the control circuit 122 deems the input terminal 104 to be floating in block 214, and may set the floating terminal detected signal (FLOAT signal 138) to a state indicating that the input terminal 104 is floating. The control circuit 122 opens the switch 132 and the switch 136 in block 214.

If, in block 204, the latch output signal 137 is sampled to be a logic high voltage (Q1 is a logic high voltage), then, the float detector 106 provides current to the input terminal 104 to pull the input terminal 104 high in block 218. The control circuit 122 releases the latch 120 from reset (via the reset signal 144), and provides the PU signal to close the switch 132 and provide current to the input terminal 104 through the pull-up circuit 112. If the input terminal 104 is not being driven by the digital circuit 102, then the current provided by the pull-up circuit 112 pulls the input terminal 104 to a logic high voltage, and the latch output signal 137 transitions from a logic high voltage to a logic low voltage (a falling edge). The falling edge of the latch output signal 137 clocks the latch 120, and the output signal Q3 of the latch 120 transitions from a logic low voltage to a logic high voltage. If the input terminal 104 is being driven by the digital circuit 102 (the input terminal 104 is not floating), then the current provided by the pull-up circuit 112 does not pull the input terminal 104 to a logic high voltage, the latch output signal 137 remains at a logic high voltage, and the output Q3 of the latch 120 does not transition to logic high voltage.

In block 220, the control circuit 122 determines whether the input terminal 104 is pulled high (a falling edge of the latch output signal 137 clocked the latch 120). If the input terminal 104 is not a logic high voltage, then the control circuit 122 deems the input terminal 104 not floating in block 216. The control circuit 122 opens the switch 132 and the switch 136 in block 216.

If the input terminal 104 is a logic high voltage in block 220, then the float detector 106 draws current from the input terminal 104 to pull the input terminal 104 low in block 222. The control circuit 122 releases the latch 118 from reset (via the reset signal 142), and provides the PD signal to close the switch 136 and draw current from the input terminal 104 through the pull-down circuit 114. If the input terminal 104 is not being driven by the digital circuit 102, then the current drawn by the pull-down circuit 114 pulls the input terminal 104 to a logic low voltage, and the latch output signal 137 transitions from a logic low voltage to a logic high voltage (a rising edge). The rising edge of the latch output signal 137 clocks the latch 118, and the output signal Q2 of the latch 118 transitions from a logic low voltage to a logic high voltage. If the input terminal 104 is being driven by the digital circuit 102 (the input terminal 104 is not floating), then the current drawn by the pull-down circuit 114 does not pull the input terminal 104 to a logic low voltage, the latch output signal 137 remains at a logic low voltage, and the output Q2 of the latch 118 does not transition to logic high voltage.

In block 224, the control circuit 122 determines whether the input terminal 104 is pulled low (a rising edge of the latch output signal 137 clocked the latch 118). If the input terminal 104 is not a logic low voltage, then the control circuit 122 deems the input terminal 104 not floating in block 216. The control circuit 122 opens the switch 132 and the switch 136 in block 216.

If the input terminal 104 is a logic low voltage, then the control circuit 122 deems the input terminal 104 to be floating in block 214, and may set the FLOAT signal 138 to a state indicating that the input terminal 104 is floating. The control circuit 122 opens the switch 132 and the switch 136 in block 214.

Figure 3A:
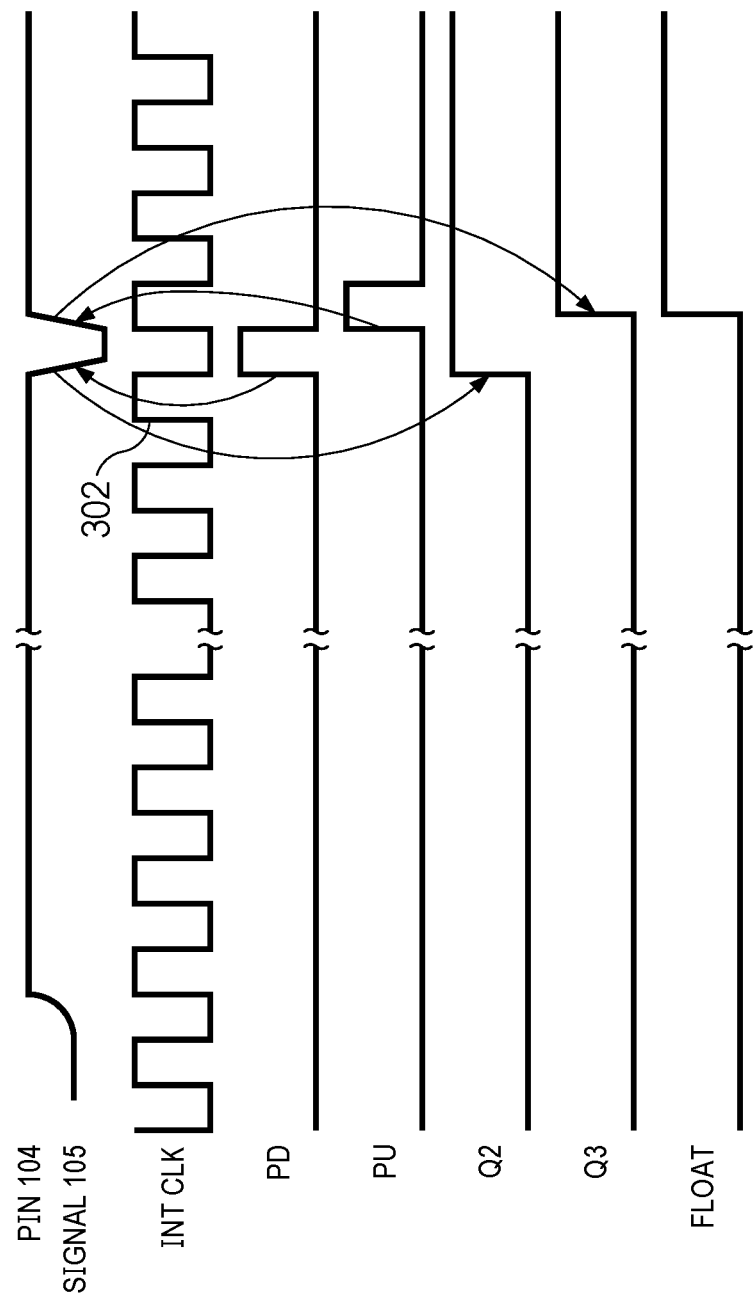
FIGS. 3A and 3B are timing diagrams of example signals in the float detector of FIG. 1.
Figure 3B:
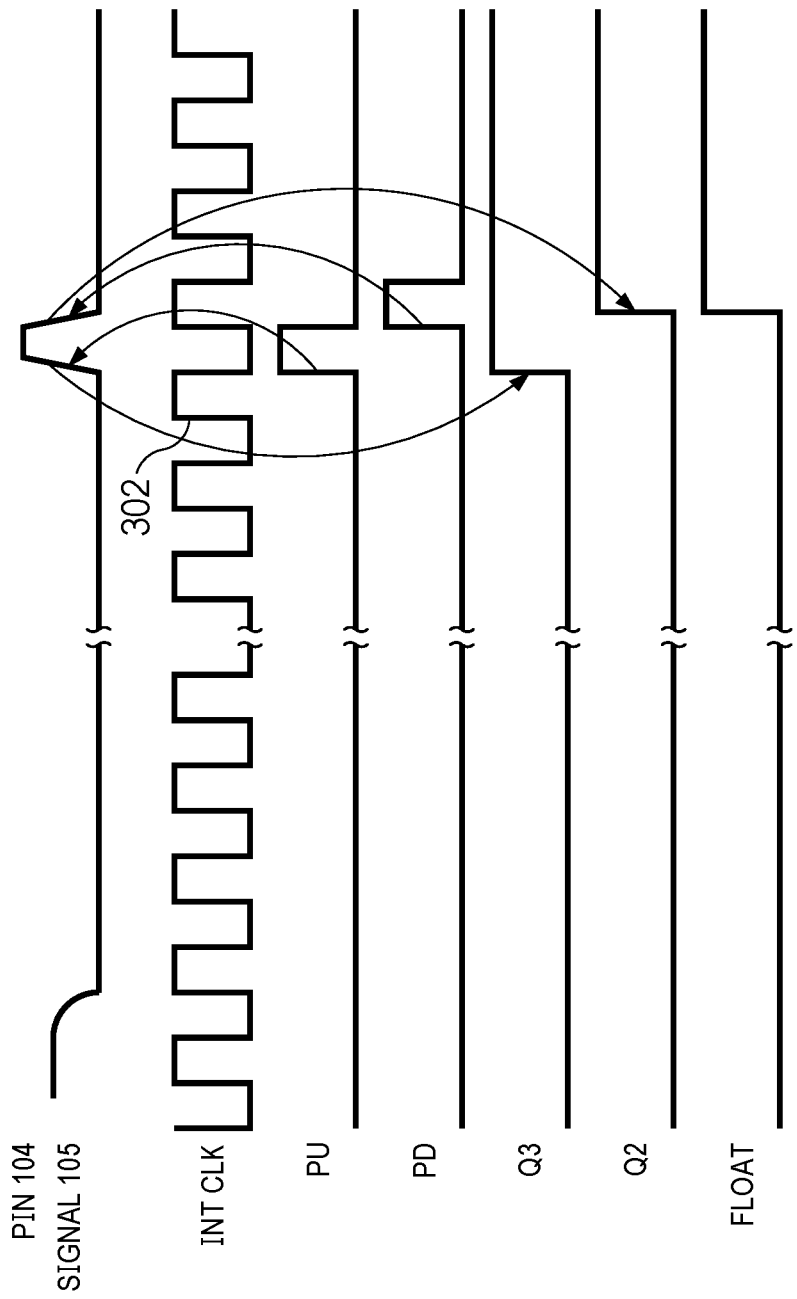

FIGS. 3A and 3B are timing diagrams of example signals in the float detector 106. In FIGS. 3A and 3B, the input terminal 104 is floating, and the float detector 106 is performing the method 200 at a selected detection interval. In FIG. 3A, the signal 105 at the input terminal 104 is illustrated as latched high. The signal INT CLK is an example internal clock of the control circuit 122 and is shown as a timing reference. At edge 302 of the INT CLK, the control circuit 122 initiates a float detection test (starts the method 200), and samples the latch output signal 137 by providing a clock edge to the latch 116. If the signal 105 is high at the edge 302, then the control circuit 122 provides the PD signal to pull the signal 105 to a logic low voltage. Pulling the signal 105 low produces a rising edge on the latch output signal 137 that clocks the latch 118, setting Q2 to a logic high voltage. Thereafter, the control circuit 122 provides the PU signal to pull the signal 105 to a logic high voltage. Pulling the signal 105 high produces a falling edge on the latch output signal 137 that clocks the latch 120, setting Q3 to a logic high voltage. Both Q2 and Q3 high indicate that the input terminal 104 is floating, and the float detector 106 may set the FLOAT signal 138 to signal the digital circuit 102 that the input terminal 104 is floating.

In FIG. 3B, the signal 105 at the input terminal 104 is illustrated as latched low. At edge 302 of the INT CLK, the control circuit 122 initiates a float detection test (starts the method 200), and samples the latch output signal 137 by providing a clock edge to the latch 116. If the signal 105 is low at the edge 302, then the control circuit 122 provides the PU signal to pull the signal 105 to a logic high voltage. Pulling the signal 105 high produces a falling edge on the latch output signal 137 that clocks the latch 120, setting Q3 to a logic high voltage. Thereafter, the control circuit 122 provides the PD signal to pull the signal 105 to a logic low voltage. Pulling the signal 105 low produces a rising edge on the latch output signal 137 that clocks the latch 118, setting Q2 to a logic high voltage. Both Q2 and Q3 high indicate that input terminal 104 is floating, and the float detector 106 may set the FLOAT signal 138 to signal the digital circuit 102 that the input terminal 104 is floating.

The float detector 106 may be used in a variety of applications. For example, circuit operation may be modified based on detection of a floating input by the float detector 106 or the floating state detected by the float detector 106 may be used to define a third logic state of an input terminal. The quiescent current consumed by the float detector 106 may be very low (e.g., 10 nanoamperes with a 10-millisecond test interval). In a watchdog circuit, the float detector 106 may be used to disable reset timing when the watchdog input is floating.

Figure 4:
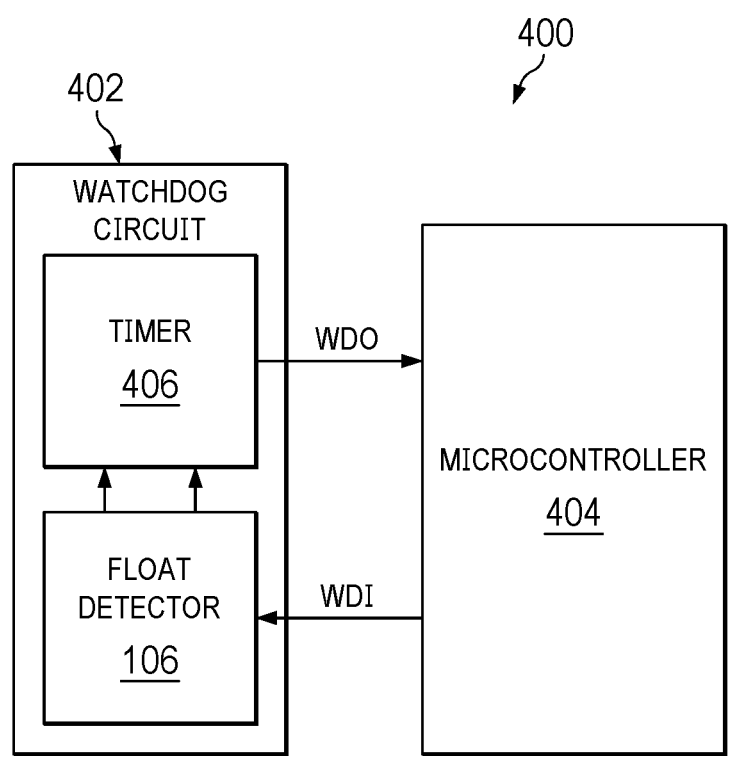
FIG. 4 is a block diagram of a microcontroller circuit with a watchdog circuit that includes the float detector of FIG. 1.

FIG. 4 is a block diagram of a microcontroller circuit 400. The microcontroller circuit 400 includes a microcontroller 404 and a watchdog circuit 402. The watchdog circuit 402 includes an input terminal and an output. The input terminal of the watchdog circuit 402 is coupled to an output of the microcontroller 404. The output of the watchdog circuit 402 is coupled to an input of the microcontroller 404. In some implementations of the microcontroller circuit 400, a WDO signal provided at the output of the watchdog circuit 402 may reset the microcontroller 404 if a WDI signal provided at the output of the microcontroller 404 (received at the input terminal of the watchdog circuit 402) does not change state over a predetermined time interval (watch interval). For example, if the WDI signal maintains a same state over a 10-millisecond interval, then the watchdog circuit 402 may provide the WDO signal to reset the microcontroller 404. However, while the microcontroller 404 is initializing, e.g., at power-up, the output of the microcontroller 404 may be unable to drive the watchdog circuit 402. For example, the output of the microcontroller 404 may be configured to operate as an input until initialization is complete. If the output of the microcontroller 404 is operating as an input, the input terminal of the watchdog circuit 402 will be floating. Thus, the watchdog circuit 402 should not provide the WDO signal to reset the microcontroller 404 if the input terminal of the watchdog circuit 402 is floating.

The watchdog circuit 402 includes a timer 406 and the float detector 106. The float detector 106 is coupled between the input terminal of the watchdog circuit 402 and the timer 406. The timer 406 is configured to time the watch interval selected to provide the WDO signal. The timer 406 includes a reset input coupled to the output of the latch circuit 108, and an enable input coupled to the float output of the float detector 106. The timer 406 is reset if the WDI signal provided by the microcontroller 404 (through the latch circuit 108) changes state, e.g., if the microcontroller 404 provides a pulse on the WDI signal within the watch interval. The float detector 106 determines whether the input of the watchdog circuit 402 is floating as described herein. The FLOAT signal 138 provided by the float detector 106 may disable or reset the timer 406 when the input to the watchdog circuit 402 is floating, thereby preventing the timer 406 from expiring, and preventing the WDO signal from resetting the microcontroller 404 when the input of the watchdog circuit 402 is floating. When the input of the watchdog circuit 402 is not floating, the timer 406 is enabled to provide WDO to the microcontroller 404 if the WDI signal does not reset the timer 406 within the watch interval.

Figure 5:
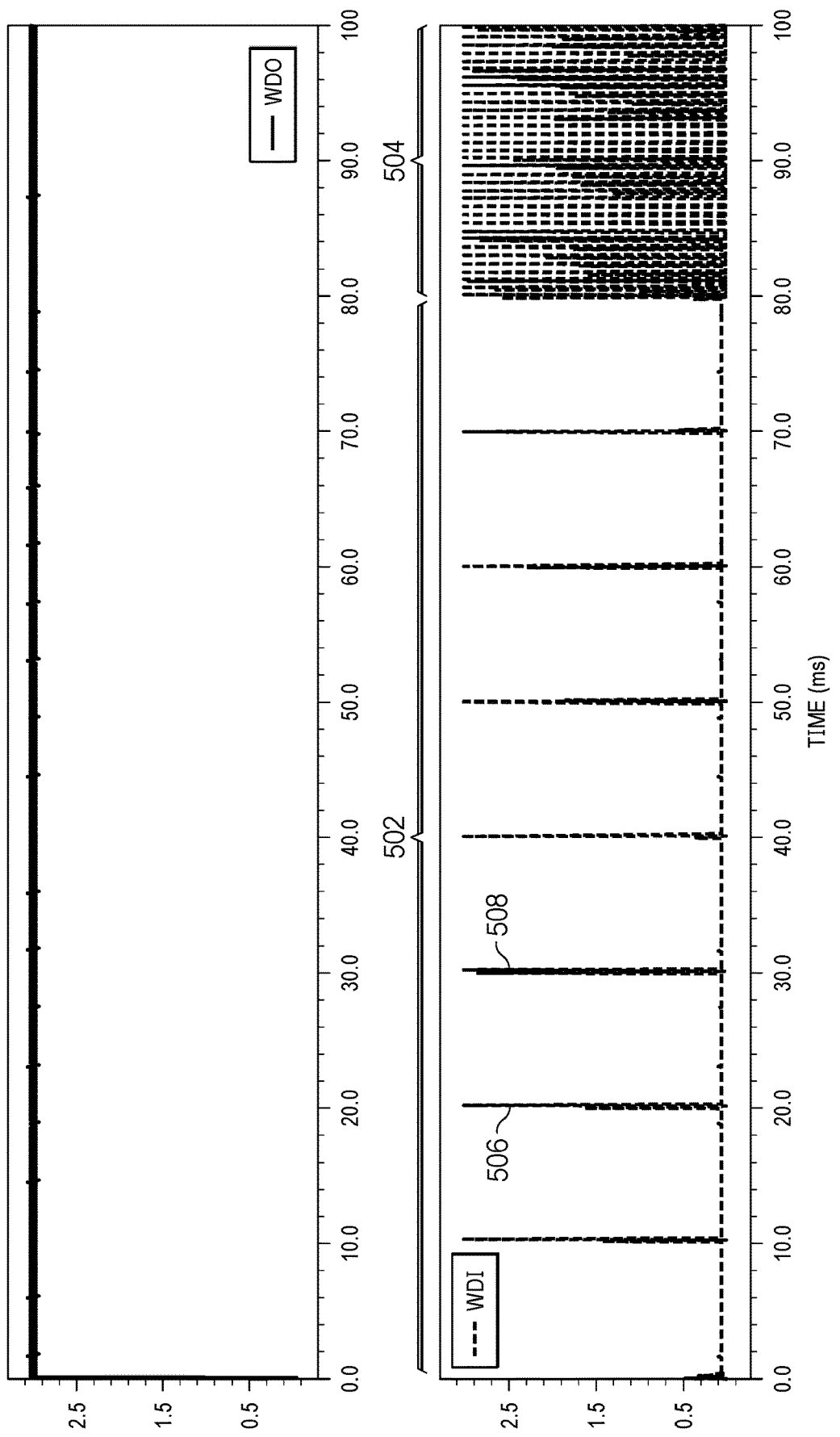
FIG. 5 is a timing diagram of signals in the microcontroller circuit of FIG. 4.

FIG. 5 is a timing diagram of signals in the microcontroller circuit 400. The WDI signal and the WDO signal are shown in FIG. 5 from power-up of the microcontroller circuit 400. In the time interval 502, the microcontroller 404 is initializing and is not driving WDI. The float detector 106 is testing the input of the watchdog circuit 402 at a 10-millisecond interval. The pulses (e.g., the pulses 506 and 508) on the WDI signal in the time interval 502, are generated by the pull-up circuit 112 and the pull-down circuit 114 of the float detector 106 driving the input of the watchdog circuit 402 during float detection. Because the float detector 106 detects the input of the watchdog circuit 402 to be floating in the time interval 502, the timer 406 is disabled and the WDO signal does not go low to reset the microcontroller 404 in the time interval 502.

In the interval 504, the initialization of the microcontroller 404 is complete, and the microcontroller 404 is driving the input of the watchdog circuit 402 to reset the timer 406. The float detector 106 detects the input of the watchdog circuit 402 to be not floating in the interval 504.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor"s body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A float detector, comprising:
   first latch having a first clock input and a first latch output;
   a second latch having a second clock input and a second latch output, the second clock input coupled to the first clock input;
   a third latch coupled between the first clock input and an input terminal;
   a control circuit having a first control input, a second control input, a first control output, and a second control output, in which:
      the first control input is coupled to the first latch output; and
      the second control input is coupled to the second latch output;
   a pull-up circuit having a current output and a third control input, in which:
      the current output is coupled to the input terminal; and
      the third control input is coupled to the first control output; and
   a pull-down circuit having a current input and a fourth control input, in which:
      the current input is coupled to the input terminal; and
      the fourth control input is coupled to the second control output.

2. The float detector of claim 1, wherein the third latch includes:
   a latch input/output (I/O) terminal coupled to the input terminal; and
   a third latch output coupled to the first clock input and the second clock input.

3. The float detector of claim 1, wherein:
   the control circuit includes a clock output and a fifth control input; and
   the float detector includes:
      a fourth latch having a third latch output, a data input, and a third clock input, in which:
         the third latch output is coupled to the fifth control input;
         the data input is coupled to the first clock input; and
         the third clock input is coupled to the clock output.

4. The float detector of claim 3, wherein:
   the fourth latch is configured to sample a voltage at the data input; and
   the control circuit is configured to, responsive to a first logic voltage at the fifth control input:
      provide a pull-up signal having a first state at the first control output and a pull-down signal having a second state at the second control output;
      and thereafter provide the pull-up signal having the second state and the pull-down signal having the first state.

5. The float detector of claim 4, wherein:
   the control circuit is configured to, responsive to a second logic voltage at the fifth control input:
      provide the pull-down signal having the first state and the pull-up signal having the second state; and thereafter
      provide the pull-down signal having the second state and the pull-up signal having the first state.

6. The float detector of claim 1, wherein:
   the first latch is configured to provide a first edge detected signal responsive to enabling the pull-down circuit;
   the second latch is configured to provide a second edge detected signal responsive to enabling the pull-up circuit; and
   the control circuit is configured to provide a floating terminal detected signal responsive to the first edge detected signal and the second edge detected signal.

7. The float detector of claim 1, wherein the pull-up circuit includes:
   a current source having a source output;
   a switch having a first terminal, a second terminal, and a switch control input, in which:
      the first terminal is coupled to the source output;
      the second terminal is coupled to the input terminal; and
      the switch control input is coupled to the first control output.

8. The float detector of claim 1, wherein the pull-down circuit includes:
a current source having a sink input;
a switch having a first terminal, a second terminal, and a switch control input, in which:
the first terminal is coupled to the input terminal;
the second terminal is coupled to the sink input; and
the switch control input is coupled to the second control output.

9. A float detector comprising:
a latch including:
a latch output; and
an input/output (I/O) terminal coupled to an input terminal; and
a float detection circuit including:
a detection input coupled to the latch output; and
a drive output coupled to the I/O terminal;
the float detection circuit configured to:
provide a drive signal at the drive output; and
determine that the input terminal is floating based on a latch output signal received at the detection input responsive to the drive signal.

10. The float detector of claim 9, wherein:
the latch is a first latch; and
the float detection circuit includes:
a control circuit;
a second latch coupled between the control circuit and the detection input, the second latch configured to detect a rising edge of the latch output signal; and
a third latch coupled between the control circuit and the detection input, the second latch configured to detect a falling edge of the latch output signal.

11. The float detector of claim 10, wherein the control circuit is configured to detect the input terminal as floating based on detection of the rising edge and detection of the falling edge.

12. The float detector of claim 10, wherein the float detection circuit includes a fourth latch coupled between the control circuit and the detection input, the fourth latch configured to sample the latch output signal.

13. The float detector of claim 10, wherein the control circuit is configured to:
provide a falling edge followed by a rising edge on the drive signal responsive to the latch output signal having a logic low voltage; and
provide a rising edge followed by a falling edge on the drive signal responsive to the latch output signal having a logic high voltage.

14. The float detector of claim 10, wherein the float detection circuit includes:
a pull-up circuit coupled between the control circuit and the I/O terminal, the pull-up circuit configured to provide current to the I/O terminal; and
a pull-down circuit coupled between the control circuit and the I/O terminal, the pull-down circuit configured to draw current from the I/O terminal.

15. A watchdog circuit, comprising:
a float detector including:
a latch including a latch output and an input/output (I/O) terminal, in which the I/O terminal is coupled to an input terminal; and
a float detection circuit including:
a detection input coupled to the latch output;
a drive output coupled to the I/O terminal; and
a float output;
the float detector configured to:
provide a drive signal at the drive output;
determine that the input terminal is floating based on a latch output signal received at the detection input responsive to the drive signal; and
provide, at the float output, a float signal indicating that the input terminal is floating; and
a timer including a reset input and an enable input, in which:
the reset input is coupled to the latch output; and
the enable input is coupled to float output.

16. The watchdog circuit of claim 15, wherein:
the latch is a first latch; and
the float detector includes:
a control circuit;
a second latch coupled between the control circuit and the detection input, the second latch configured to detect a rising edge of the latch output signal; and
a third latch coupled between the control circuit and the detection input, the third latch configured to detect a falling edge of the latch output signal.

17. The watchdog circuit of claim 16, wherein the control circuit is configured to detect the input terminal as floating based on detection of the rising edge and detection of the falling edge.

18. The watchdog circuit of claim 16, wherein the float detector includes a fourth latch coupled between the control circuit and the detection input, the fourth latch configured to sample the latch output signal.

19. The watchdog circuit of claim 18, wherein the control circuit is configured to:
provide a falling edge followed by a rising edge on the drive signal responsive to the latch output signal having a logic low voltage; and
provide a rising edge followed by a falling edge on the drive signal responsive to the latch output signal having a logic high voltage.

20. The watchdog circuit of claim 16, wherein the float detector includes:
a pull-up circuit coupled between the control circuit and the I/O terminal, the pull-up circuit configured to provide current to the I/O terminal; and
a pull-down circuit coupled between the control circuit and the I/O terminal, the pull-down circuit configured to draw current from the I/O terminal.

* * * * *